United States Patent [19]

Kaltenecker

[11] Patent Number: 5,051,710
[45] Date of Patent: Sep. 24, 1991

[54] VARIABLE $Z_o$ TRANSMISSION LINE TRANSFORMER

[75] Inventor: Robert S. Kaltenecker, Mesa, Ariz.

[73] Assignee: Motorola, Inc., Schaumburg, Ill.

[21] Appl. No.: 543,505

[22] Filed: Jun. 25, 1990

[51] Int. Cl.⁵ .......................... H03H 7/38; H01P 5/02
[52] U.S. Cl. ......................................... 333/32; 333/33
[58] Field of Search ................. 333/119, 116, 131, 25, 333/32, 33; 336/69, 170, 171, 188, 221, 229

[56] References Cited

U.S. PATENT DOCUMENTS

| | | | |
|---|---|---|---|
| 1,840,434 | 1/1932 | Cowan | 333/131 |
| 2,657,362 | 10/1953 | Epperson | 333/32 |
| 2,943,275 | 6/1960 | Bittner et al. | 333/26 |
| 3,168,715 | 2/1965 | Woodworth | 333/119 |
| 3,614,676 | 10/1971 | Boelke | 333/26 |
| 4,275,364 | 6/1981 | Skatvold, Jr. | 333/33 |
| 4,375,054 | 2/1983 | Pavio | 333/116 |
| 4,839,616 | 6/1989 | Herzog | 333/32 |

*Primary Examiner*—Paul Gensler
*Attorney, Agent, or Firm*—Joe E. Barbee

[57] ABSTRACT

A transmission line transformer is used for impedance matching in high frequency, broadband applications. The characteristic impedance, $Z_o$, of the transmission line transformer is adjusted to an optimum value by terminating the ends of the transmission line using variable capacitors. The capability to trim the transmission line transformer to an optimum value of $Z_o$ reduces the criticality of the various factors which influence $Z_o$ during the manufacturing process.

10 Claims, 2 Drawing Sheets

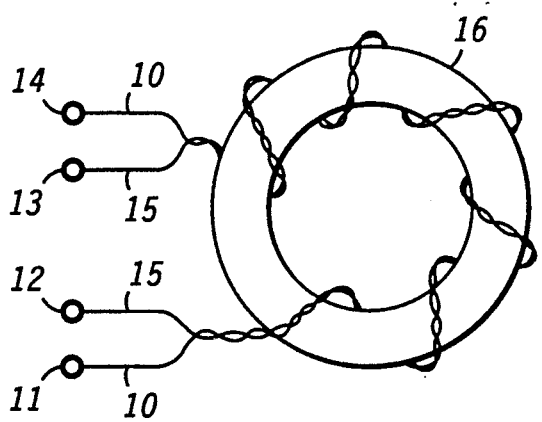
FIG. 1
FIG. 2
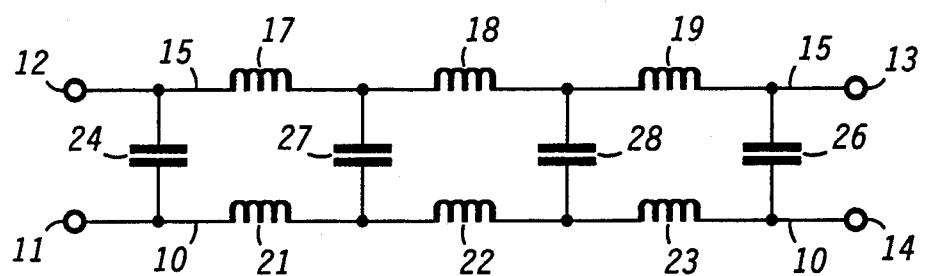
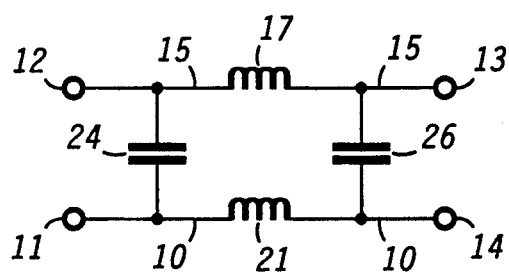
FIG. 3
FIG. 4
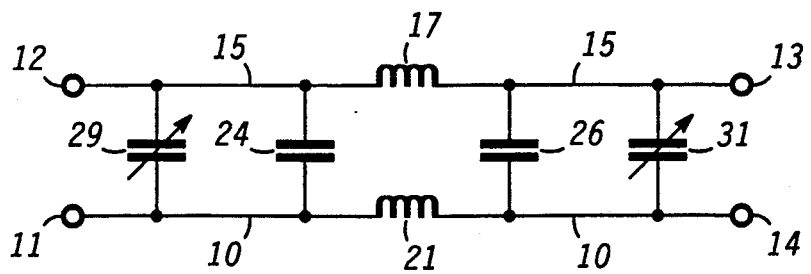

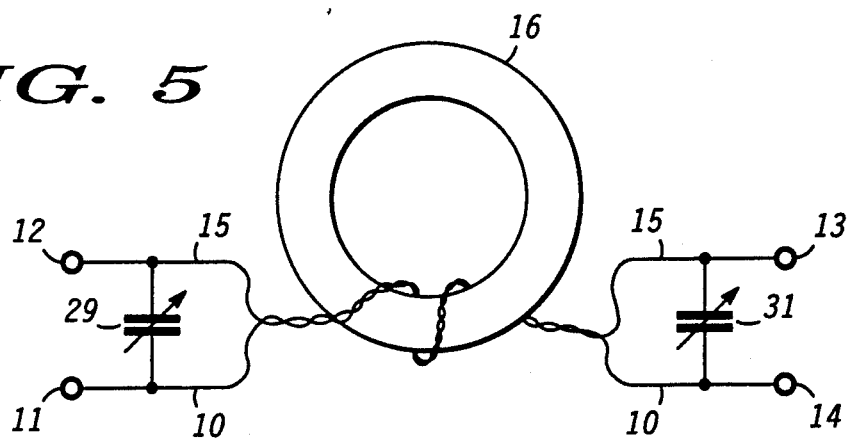
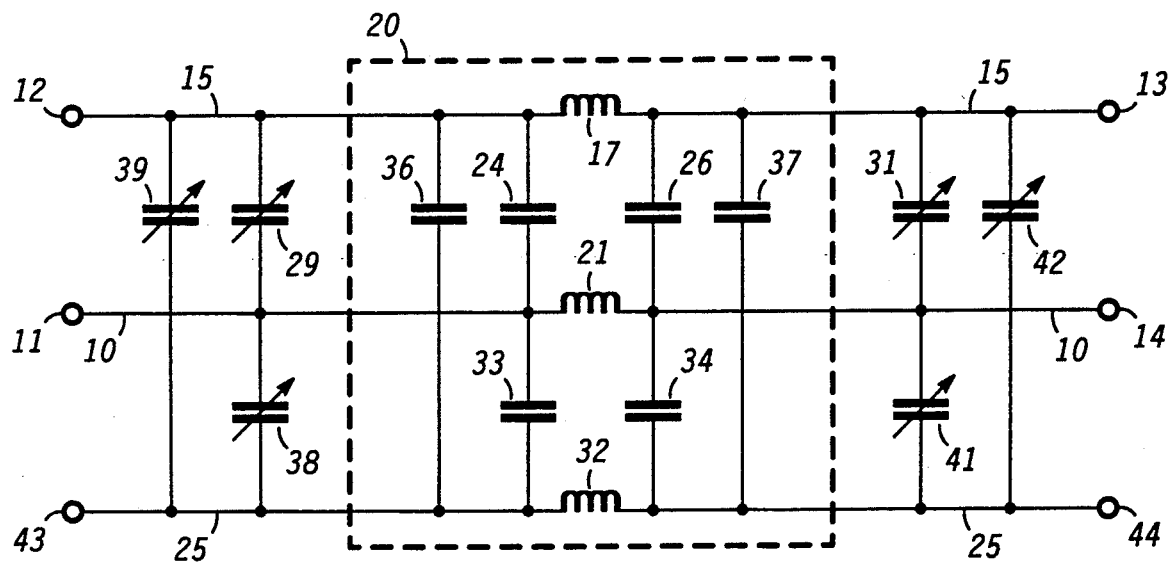
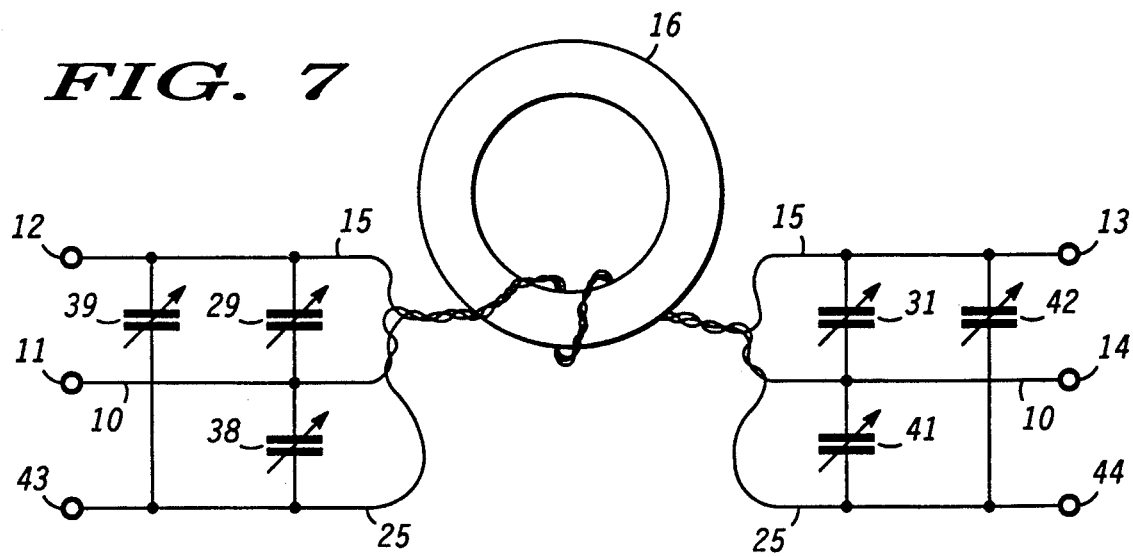

VARIABLE $Z_O$ TRANSMISSION LINE TRANSFORMER

BACKGROUND OF THE INVENTION

The present invention relates, in general, to impedance matching transformers, and more particularly to a transmission line transformer having an adjustable characteristic impedance.

In any application involving transfer of a signal from the output of one stage to the input of another stage, it is necessary that the output impedance of the first stage be matched to the input impedance of the next stage. If two stages with different impedances are coupled without the benefit of matched impedances, significant attenuation of the signal will occur. At relatively low frequencies or narrow band applications, the impedance matching function is normally accomplished by using an impedance matching transformer. The conventional impedance matching transformer generally consists of two electrical conductors wound as coils, coupled by flux linkages. Impedance matching is accomplished by means of using the proper ratio of the number of turns of each of the coils.

The frequency response of such conventional impedance matching transformers, however, precludes their use in applications involving relatively high frequencies or in applications requiring broadband response. In 1959 C. L. Ruthroff, in his paper "Some Broadband Transformers",(Proc. IRE, vol. 47, pp 1,337-1342, August 1959), made an in depth exploration of the use of transmission lines as impedance matching transformers. Following the publication of Ruthroff's treatise, transmission line transformers became widely used in high frequency impedance matching applications.

The basic transmission line transformer consisted of a twisted pair of wires wrapped around a ferrite toroid core. A peculiarity of all transmission line transformers was that, rather than the virtually infinite ratios available from a conventional transformer, there was a limited number of discrete ratios which could be realized from a transmission line transformer. For instance, a bifilar transformer as just described would yield impedance matching ratios of 1/1 or 4/1, depending upon how it was connected. A trifilar transformer would yield matching ratios of 1/1, 9/4, and 9/1.

The critical parameter for a transmission line transformer was its characteristic impedance, $Z_O$. For optimum circuit performance, $$Z_O = (Z_{IN} Z_{OUT})^{\frac{1}{2}}.$$

Characteristic impedance $Z_O$ was dependent upon a number of factors, including the wire used, the type and thickness of insulation on the wire, how tightly the wire was twisted, the permeability of the core, and how the wire was wound on the core. Other factors may have also impacted $Z_O$. Control of these many parameters in a production environment was difficult. At relatively low frequencies, some variation from the optimum value for $Z_O$ could be tolerated. However, the need to control $Z_O$ became more acute in applications utilizing frequencies nearing the gigahertz range. Until now the only method of adjusting $Z_O$ after the transmission line transformer was manufactured was to physically move the wires on the toroid. This proved to be a very inexact method of making a precision adjustment. It also introduced the risk of inadvertently damaging either the transformer itself or possibly some adjacent circuitry.

SUMMARY OF THE INVENTION

The objects and advantages of the present invention are to provide an improved scheme for adjusting the characteristic impedance of a transmission line transformer used in high frequency, broadband applications. The variable $Z_O$ transmission line transformer consists of at least one pair of electrical conductors of less than one quarter of the wavelength of the highest intended operating frequency of the transformer, with variable capacitors terminating the ends of each pair. The $Z_O$ of the transformer is trimmed to the optimum value by trimming the values of the capacitors. The unique method alleviates the requirement to critically control the numerous factors which affect the characteristic impedance by providing a method of critically tuning the transformer after manufacturing is complete.

BRIEF DESCRIPTION OF THE DRAWINGS

FIG. 1 is a diagram of a bifilar transmission line transformer wrapped on a ferrite toroid;

FIG. 2 is a schematic diagram which models the transmission line transformer of FIG. 1, showing distributed capacitance;

FIG. 3 is an approximate schematic diagram model of an electrically very short transmission line transformer;

FIG. 4 is an approximate schematic diagram model of an electrically very short transmission line transformer having variable capacitors connected across its leads;

FIG. 5 is a diagram of a bifilar transmission line transformer wrapped on a ferrite toroid with variable capacitors connected across its leads;

FIG. 6 is a schematic diagram model of an electrically very short trifilar transmission line transformer having variable capacitors connected across its leads; and FIG. 7 is a diagram of a trifilar transmission line transformer wrapped on a ferrite toroid with variable capacitors connected across its leads.

DETAILED DESCRIPTION OF THE DRAWINGS

A typical transmission line transformer is illustrated in FIG. 1. The transformer consists of electrical conductor 10, with one end designated as node 11 and the other end as node 14, and electrical conductor 15, with one end designated as node 12 and the other end as node 13. Conductors 10 and 15 are twisted about each other tightly. The tighter the twist, the more uniform the coupling between conductors will be, and the more consistent the characteristic impedance, $Z_O$, will be. The twisted pair of conductors 10 and 15 is then wound about a core made of a magnetic medium, illustrated in FIG. 1 as toroid 16. The permeability of the core influences the low-end frequency response of the transformer. Typically, ferrite is chosen as the core material. The toroid configuration is efficient because the magnetic lines of flux tend to remain within the body of the toroid. However, a rod, a mechanically simpler configuration, could possibly be used. The one draw back is that, because with a rod much of the magnetic path is in air, the low frequency response is not as good as that of a toroid configuration. An additional alternate configuration would be to use a "binocular", or multi-hole, core. The advantage of this configuration is the ability to construct two transformers in close proximity so that they can be easily interconnected, reducing lead inductance.

A typical electrical model of a transmission line used as an impedance matching transformer is illustrated schematically in FIG. 2. Electrical conductor 15 is represented by inductors 17, 18, and 19 connected in series. Electrical conductor 10 is represented by inductors 21, 22, and 23 connected in series. These inductors are interspaced with capacitors 24, 26, 27, and 28, representing the distributed capacitance between electrical conductors 10 and 15. One end of capacitor 24 connects to node 12 and to one end of inductor 17. The second end of capacitor 24 connects to node 11 and to one end of inductor 21. One end of capacitor 26 connects to node 13 and to one end of inductor 19. The second end of capacitor 26 connects to node 14 and to one end of inductor 23. One end of capacitor 27 connects to the second end of inductor 17 and to one end of inductor 18. The second end of capacitor 27 connects to the second end of inductor 21 and to one end of inductor 22. One end of capacitor 28 connects to the second end of inductor 18 and to one end of inductor 19. The second end of capacitor 28 connects to the second end of inductor 22 and to one end of inductor 23. Neglecting resistive losses, it is these inductances and distributed capacitances that determine $Z_o$ of the transmission line transformer.

The characteristics of transmission lines come into play in determining the length of the transmission line in the transmission line transformer. In an ideal situation for a transmission line, the impedances at both ends of the transmission line would be equal, and would equal the characteristic impedance of the transmission line. An impedance matching application presupposes, however, that the impedances at either end of the transmission line are not equal. Therefore, standing waves will occur in the transmission line. In a standing wave, a dip in frequency response occurs at a quarter wavelength, or the ninety degree point of the wave. Therefore, if the transmission line is a quarter wavelength long, the signal transferred through the transmission line may be severely attenuated. Thus it becomes necessary to insure that the length of the transmission line used in an impedance matching transformer is much less than one quarter of the wavelength of the highest operating frequency of the transformer. Best performance is obtained when the transmission line is less than one third of a quarter wavelength, or less than thirty degrees, long.

When operating frequencies approach the gigahertz range, signal wavelengths become very short. It may take three or fewer turns on a toroid to achieve the desired fraction of a wavelength. When the transmission line becomes extremely short in this way, the model illustrated in FIG. 2 can be simplified as in FIG. 3. Here, inductors 18, 19, 22, and 23, as well as capacitors 27 and 28, have been eliminated. The second end of inductor 17 connects to node 13 and to one end of capacitor 26, while the second end of inductor 21 connects to node 14 and to the second end of capacitor 26. The important point here is that, in a very short transmission line, all of the distributed capacitance can be represented by only two lumped capacitive elements, one at each end of the line.

The present invention is intended for use in applications nearing or in the gigahertz range. The transmission line used as a transmission line transformer is thus so short that the capacitive elements can be lumped as in FIG. 3. It thus becomes possible to modify the $Z_o$ of the transmission line transformer by modifying the capacitive contribution to the impedance. In FIG. 4, the capacitance of the transmission line transformer is modified by adding variable capacitor 29 between nodes 11 and 12, in parallel with capacitor 24, and variable capacitor 31 between nodes 13 and 14, in parallel with capacitor 26. Note that capacitors 24 and 26 do not actually exist, but represent the distributed capacitance of the transmission line transformer as seen by looking into nodes 11 and 12 in the case of capacitor 24, and nodes 13 and 14 in the case of capacitor 26. Note also that this would not work with the model of FIG. 2 because capacitors 27 and 28, representing the distributed capacitance of the midsection of the transmission line, are not accessible from nodes 11, 12, 13, and 14.

FIG. 5 illustrates the physical implementation of the transmission line transformer with conductors 10 and 15 shortened and with capacitors 29 and 31 connected across nodes 11 and 12, and nodes 13 and 14 respectively. In both FIG. 4 and FIG. 5, capacitors 29 and 31 are depicted as variable capacitors. This is not strictly necessary. It is conceivable that there are applications wherein the manufacturing tolerances are tight enough and the requirements of the application are loose enough that fixed capacitors of predetermined value could be used. Normally, however, it will be desirable to have the flexibility of capacitors whose value can be adjusted dynamically to trim or tune the $Z_o$ of the transmission line transformer to exactly fit the requirements of the particular application. The preferred embodiment of the present invention thus includes the provision for trimming the values of the capacitors. Thus the capacitors could be made by laminating parallel plates on opposite sides of a dielectric, allowing them to be trimmed to the desired value with a laser. Alternately, the capacitors could be made from interdigitated parallel lines which could then be selectively cut to adjust the capacitors to the desired values.

The preceding discussion focused on a bifilar configuration, i.e., a pair of twisted conductors. The present invention is not limited to such a configuration. Any number of electrical conductors can be twisted together and used as a transmission line transformer. Since the conductors are all twisted together in a bundle, every conductor is coupled by a distributed capacitance to every other conductor in the bundle. Thus every conductor can be seen as forming a pair with each of the other conductors in the bundle. Each pair of conductors must be terminated on both ends by an adjustable capacitor.

A trifilar implementation is illustrated by way of example in FIG. 6 and FIG. 7. The trifilar transmission line transformer is modeled in FIG. 6 within dotted line 20. Note that with the addition of a single conductor, the number of capacitors modelling the distributed capacitance increases from two to six. Inductor 32 represents the inductance of conductor 25 of FIG. 7. The ends of inductor 32 are designated as nodes 43 and 44. Capacitor 33 connects from node 43 to node 11, while capacitor 34 connects from node 44 to node 14. Capacitors 33 and 34 represent the distributed capacitive coupling between conductor 25 and conductor 10. Capacitor 36 connects from node 43 to node 12, while capacitor 37 connects from node 44 to node 13. Capacitors 36 and 37 represent the distributed capacitive coupling between conductor 25 and conductor 15. Variable capacitor 38 is connected across nodes 11 and 43, in parallel with capacitor 33. Variable capacitor 39 is connected across nodes 12 and 43, in parallel with capacitor 36. Variable capacitor 41 is connected across nodes 14 and 44, in parallel with capacitor 34. Variable capacitor 42 is connected across nodes 13 and 44, in parallel with capacitor 37. Capacitors 29, 31, 38, 39, 41, and 42 are then all trimmed to optimize the $Z_O$ of the transmission line transformer. The same technique extends to all multifilar configurations.

By now it should be appreciated that there has been provided a unique method of adjusting the characteristic impedance of a transmission line transformer used in impedance matching applications. By recognizing that an electrically very short transmission line can be modelled by a simplified circuit, the applicability of using variable capacitors to modify the characteristic impedance of the broadband transmission line transformer becomes evident. This approach simplifies the manufacturing process while improving the precision of the impedance matching function.

What is claimed is:

1. A variable characteristic impedance transmission line transformer, comprising:
   at least one pair of electrical conductors having an electrical length of less than one quarter wave length at the highest operating frequency of the transformer, the at least one pair of electrical conductors being wound on a magnetic medium, each conductor having a first end and a second end; and
   a first capacitor and a second capacitor for each pair of conductors, the first capacitor coupling between the first ends of the conductors of the pair, the second capacitor coupling between the second ends of the conductors of the pair.

2. The transmission line transformer according to claim 1 wherein the conductors are twisted together.

3. The transmission line transformer according to claim 1 wherein the electrical length of the conductors is less than one third of one quarter wavelength of the highest operating frequency of the transformer.

4. The transmission line transformer according to claim 1 wherein the value of the capacitors is variable.

5. A variable characteristic impedance transmission line transformer, comprising:
   a plurality of electrical conductors, each conductor forming a pair of conductors with every other conductor, the plurality of electrical conductors are wound on a magnetic medium, each conductor having a first end and a second end; and
   a first capacitor and a second capacitor for each pair of conductors, the first capacitor coupling between the first ends of the conductors of the pair, the second capacitor coupling between the second ends of the conductors of the pair.

6. The transmission line transformer according to claim 5 wherein the electrical length of the conductors is less than one third of one quarter wavelength of the highest operating frequency of the transformer, where the highest operating frequency is in the gigahertz range.

7. The transmission line transformer according to claim 6 wherein the magnetic medium comprises a ferrite rod.

8. The transmission line transformer according to claim 6 wherein the magnetic medium comprises a ferrite toroid.

9. The transmission line transformer according to claim 6 wherein the values of the capacitors are adjustable in order to tune the characteristic impedance of the transformer.

10. A method for modifying the characteristic impedance of a transmission line transformer, comprising:
    forming a transmission line transformer by twisting a pair of wires around a magnetic medium;
    connecting a first capacitor across a first end of the transmission line transformer;
    connecting a second capacitor across a second end of the transmission line transformer; and
    adjusting the value of the first and second capacitors until the desired characteristic impedance is achieved.

* * * * *